United States Patent
Akiya

(10) Patent No.: US 6,329,880 B2
(45) Date of Patent: Dec. 11, 2001

(54) RADIO FREQUENCY TRANSMITTING CIRCUIT

(75) Inventor: Makoto Akiya, Saitama (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/761,588

(22) Filed: Jan. 18, 2001

(30) Foreign Application Priority Data

Feb. 2, 2000 (JP) .................................................. 12-024616

(51) Int. Cl.[7] .................................................. H03F 1/52
(52) U.S. Cl. ....................... 330/298; 330/207 P; 455/115
(58) Field of Search ................................ 330/207 P, 298; 455/115, 117

(56) References Cited

U.S. PATENT DOCUMENTS

| | | | |
|---|---|---|---|
| 4,122,400 | * 10/1978 | Medendorp et al. | 330/207 P |
| 5,038,112 | * 8/1991 | O'Neil | 330/298 |
| 5,334,945 | * 8/1994 | Yokoya et al. | 330/207 P |
| 5,543,760 | * 8/1996 | Honda et al. | 330/298 |
| 5,678,209 | * 10/1997 | Strakovsky | 455/115 |

FOREIGN PATENT DOCUMENTS

| | | |
|---|---|---|
| 57-118412 | 7/1982 | (JP) . |
| 63-260305 | 10/1988 | (JP) . |
| 2630250 | 4/1997 | (JP) . |

* cited by examiner

Primary Examiner—Robert Pascal
Assistant Examiner—Khanh Van Nguyen
(74) Attorney, Agent, or Firm—McGuireWoods LLP

(57) ABSTRACT

An object of the present invention is to allow the miniaturization of a mobile communication equipment and the reduction of consumption power, and to improve the electrical characteristics of a final stage amplifier. An inputted RF signal is amplified to a specified transmission output by a final stage amplifier, the output power and a reflected wave generated by mismatching between an output impedance of the final stage amplifier and a load impedance connected to an output side of the final stage amplifier are detected by a directional coupler. Two switches are selectively switched in a time division manner, a DC voltage corresponding to the reflected wave is selected, a comparator compares a threshold voltage with the DC voltage, a switch is switched by an output of the comparator outputted in accordance with the comparison, and gate voltages are selectively applied to the final stage amplifier.

8 Claims, 5 Drawing Sheets

RADIO FREQUENCY TRANSMITTING CIRCUIT

BACKGROUND OF THE INVENTION

1. Technical Field of the Invention

This invention relates to a transmitting circuit for a mobile communication equipment having an automatic output power control circuit (APC), and particularly relates to a transmitting circuit having a directional coupler capable of detecting power outputted from a final stage amplifier and a reflected wave generated by the mismatching between the output impedance of the final stage amplifier and a load impedance connected to the output side of the final stage amplifier, and allowing the gate voltage of the final stage amplifier to be switched depending on the amplitude of this reflected wave.

2. Description of the Prior Art

As a radio frequency power amplifier used in the transmitting circuit of a conventional transmitter, Japanese Patent Application Laid-Open No. 57-118412, for example, discloses a radio frequency power amplifier wherein reflected power from the load of variable gain power amplification means of which gain varies with an external control voltage is detected by detection means. The reflected output is converted by DC conversion means. Further, the highest voltage is selected from among the converted voltages by selection means. The selected voltage is inputted into a comparator which determines the starting point of the gain control of the variable gain power amplification means. The converted voltage is outputted to control means by switch means, when the converted voltage exceeds a voltage set by the variable gain power amplification means, and this control means controls the gain of the variable gain power amplification means.

Further, FIG. 5 is a block diagram showing the constitution of a transmitting circuit for a conventional mobile communication equipment or the like.

In FIG. 5, a gate voltage 20 is applied to a gate of a final stage amplifier 21 amplifying a radio frequency signal and the output side of the final stage amplifier 21 is connected to an antenna 24 through a directional coupler 22 and an isolator 23.

Out of two detection outputs of the directional coupler 22, one detection output is grounded through a terminating resistor 25, while the other detection output inputs a detection voltage into the positive input terminal of a comparator 27 through a detection diode 26.

The detection diode 26 detects the output or reflected wave of the final stage amplifier 21 obtained from the directional coupler 22 and converts the detected output or reflected wave into a DC voltage, and the comparator 27 compares this DC voltage with a threshold voltage 28.

This threshold voltage 28 is applied to the negative input terminal of the comparator 17. The threshold voltage 28 is determined in advance by the characteristic of a load impedance connected to the output side of the final stage amplifier 21 and the reflected wave which is converted into a DC voltage by the detection diode 26.

The comparator 27 compares this threshold voltage 28 with the DC voltage of the detection diode 26, outputs an "H" level or an "L" level depending on whether or not the DC voltage is higher than the threshold voltage 28, supplies the output to an APC (circuit 29 and allows the APC circuit 29 to control the final stage amplifier 21.

In such a conventional transmitting circuit, the isolator 23 is inserted into the output side of the final stage amplifier 21, whereby the load impedance of the final stage amplifier 21 is intended to be stabilized and stable output distortion characteristic and consumption power are ensured.

Due to this, there is no avoiding outputting transmission power including the insertion loss of the isolator from the final amplifier so as to output specified transmission power from the antenna. The conventional transmitting circuit is not, therefore, suited for the reduction of consumption power.

Furthermore, since the isolator is a large component, the isolator is disadvantageously unsuited for miniaturization.

Meanwhile, the reduction of consumption power and the miniaturization of mobile communication equipment are increasingly underway in recent years. In these circumstances, it is demanded to secure the stable output distortion characteristics of a final stage amplifier and consumption power and to realize low power consumption and miniaturization.

SUMMARY OF THE INVENTION

An object of the present invention is to provide a transmitting circuit capable of making a mobile communication equipment small, capable of reducing consumption power and capable of being excellent in the electrical characteristics of a final stage amplifier.

The transmitting circuit of the present invention is characterized by comprising: a final stage amplifier amplifying an inputted radio frequency (RF) signal to a specified transmission output, and capable of controlling consumption power and output distortion by a direct current voltage applied to a gate; a directional coupler having a terminal capable of detecting output power outputted from the final stage amplifier, and a terminal capable of detecting a reflected wave generated by mismatching between an output impedance of the final stage amplifier and a load impedance connected to an output side of the final stage amplifier; two first switches appropriately selecting the terminals of the directional coupler in a time division manner; a terminating resistor provided to correspond to each of the first switches, and terminating the terminal of the directional coupler unselected by the first switches; a detection diode converting each of the output power and the reflected wave obtained by the directional coupler into a direct current voltage; a second switch selecting, switching and outputting one of the direct current voltage with respect to the output power and the direct current voltage with respect to the reflected wave obtained by the detection diode; and gate voltage control means for applying a gate voltage suited for the load impedance to the final stage amplifier in accordance with the direct current voltage with respect to the reflected wave selected by the second switch.

The final stage amplifier amplifies the inputted radio frequency signal to the specified transmission output, the output power of the final stage amplifier is detected by the directional coupler, and the reflected wave generated by the mismatching between the output impedance of the final stage amplifier and the load impedance connected to the output side of the final stage amplifier is detected and supplied to the two first switches.

The first switches are switched in a time division manner, the output power of the final stage amplifier and the reflected wave are selectively applied to the detection diode and detected by the detected diode. By doing so, the output power or the reflected wave is converted into a direct current voltage and applied to the second switch.

If the second switch is switched in a time division manner to select the direct current voltage corresponding to the reflected wave, the gate voltage control means applies a gate voltage suited for the load impedance to the final stage amplifier in accordance with the direct current voltage corresponding to the reflected wave. Thus, it is possible to miniaturize a mobile communication equipment, reduce consumption power and make the final stage amplifier exhibit excellent electrical characteristics.

As stated so far, according to this invention, the reflected wave generated by the mismatching between the output impedance of the final stage amplifier and the load impedance connected to the output of the final stage amplifier is detected, and the gate voltage suited for the load impedance is applied to the gate of the final stage amplifier by the gate voltage control means. As a result, it is possible to dispense with an isolator which is a large-sized component required conventionally, and according to that, specified transmission power may be outputted from the final stage amplifier. Therefore, it is possible to miniaturize a mobile communication equipment small, to reduce consumption power and to obtain the electrical characteristics of the final stage amplifier.

PREFERRED EMBODIMENT OF THE INVENTION

Figure 1:
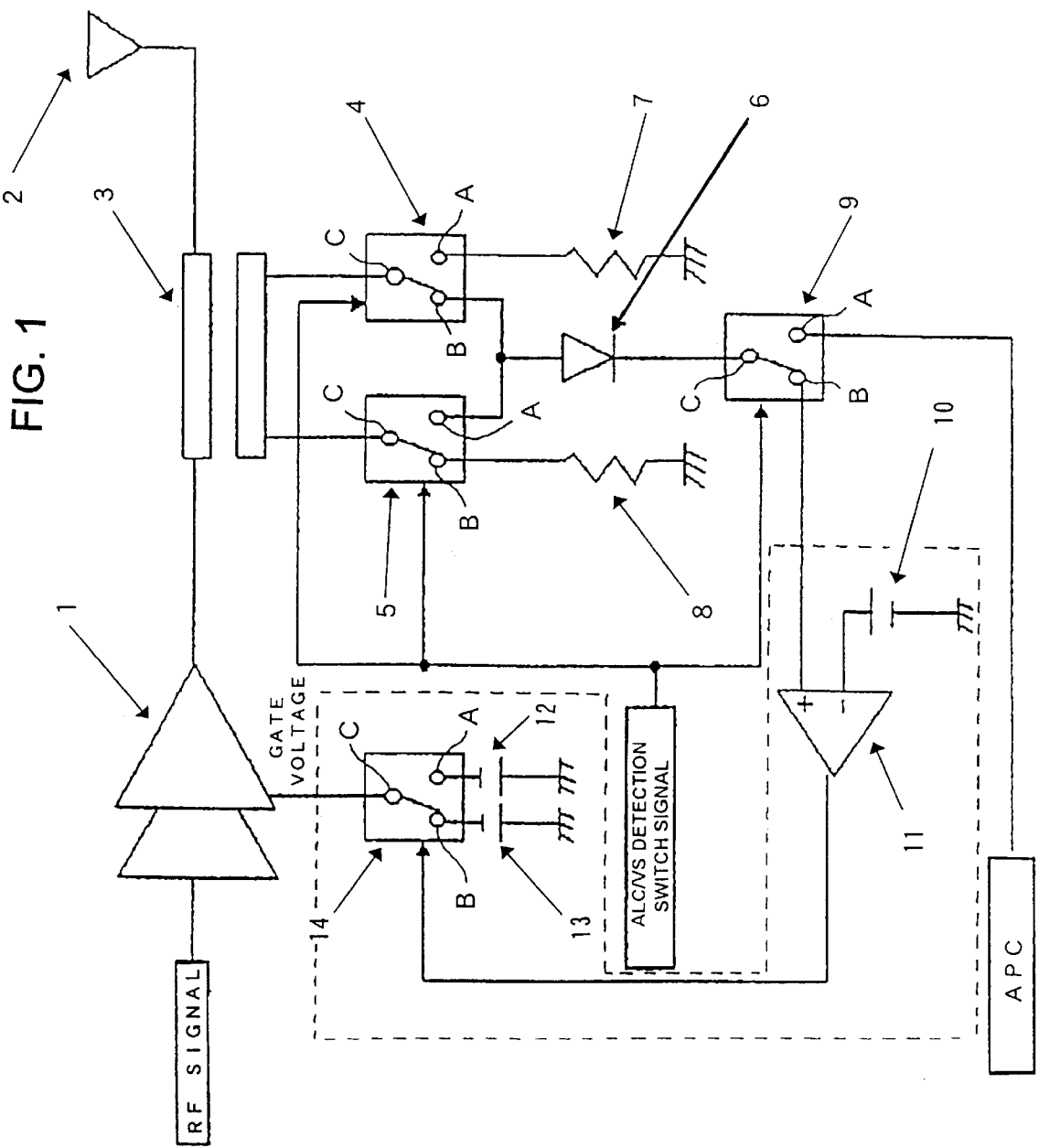
FIG. 1 is a block diagram showing the constitution of a first embodiment of a transmitting circuit according to the present invention.

FIG. 1 is a block diagram showing the constitution of a first embodiment of a transmitting circuit according to this invention. In FIG. 1, a radio frequency signal is inputted into a final stage amplifier 1 mainly consisting of a transistor.

This radio frequency (RF) signal is amplified by the final stage amplifier 1 to a specified transmission output. A plurality of optimum gate voltages are applied to the gate of the final stage amplifier 1.

By being applied with the optimum gate voltages, the final stage amplifier 1 can function as a amplifier capable of controlling consumption power and output distortion.

The output terminal of the final stage amplifier 1 is connected to an antenna 2 through a directional coupler 3. The directional coupler 3 has a terminal capable of detecting output power outputted from the final stage amplifier 1 and a terminal capable of detecting a reflected wave generated by the mismatching between the output impedance of the final stage amplifier 1 and a load impedance connected to the output of the final stage amplifier 1.

These two terminals of the directional coupler 3 are connected to the movable terminals C of two switches 4 and 5 appropriately selecting the terminals in a time division manner, respectively.

Each of the switches 4 and 5 has two fixed terminals A and B. The movable terminals C of the switches 4 and 5 switch over the fixed terminals A and B in a time division manner by an APC/VS (Voltage Standing) detection switch signal.

In FIG. 1, the respective switches used in this invention are represented as mechanical switches. Actually, however, electronic switches are used.

The fixed terminal A of the switch 4 and the fixed terminal B of the switch 5 are grounded through terminating resistors 7 and 8, respectively.

The terminating resistors 7 and 8 are resistors terminating the corresponding terminals of the direction coupler 3 when the terminals are not selected.

The fixed terminal B of the switch 4 and the fixed terminal A of the switch 5 are connected in common to the movable terminal C of a switch 9 by way of a detection diode 6.

The detection diode 6 is a diode detecting the output power and reflected wave of the final stage amplifier 1 obtained by the directional coupler 3, and converts each of the detected output power and reflected wave into a DC voltage.

The switch 9 has two fixed terminal A and B, as well. The movable terminal C switches over the two fixed terminals A and B in a time division manner by the above-stated APC/VS detection switch signal.

If the movable terminal C of the switch 9 is switched to the fixed terminal B side, the DC voltage corresponding to the reflected wave is applied to the positive input terminal of a comparator 11.

Further, if the movable terminal C of the switch 9 is switched to the fixed terminal A side, the DC voltage corresponding to the output power is supplied from the fixed terminal A side to the APC which is not shown in the figure.

A threshold voltage 10 is applied to the negative input terminal of the comparator 11. This threshold voltage 10 is a voltage predetermined by the characteristics of the load impedance connected to the output of the terminal amplifier 1.

The comparator 11 compares the DC voltage corresponding to the reflected wave selected from the fixed terminal B side of the switch 9 with this threshold voltage 10. As a result of the comparison, if the DC voltage is higher than the threshold voltage 10, the comparator 11 outputs an "H" level. If the DC voltage is lower than the threshold voltage, the comparator 11 outputs an "L" level.

The output of the comparator 11 allows switch-controlling the movable terminal C of a switch 14.

The switch 14 has a movable terminal C and two fixed terminals A and B, as well. Gate voltages 12 and 13 for final stage amplification, having different voltages are applied to the fixed terminals A and B, respectively.

If the movable terminal C of the switch 14 is switch-controlled by the output of the comparator 11, one of the fixed terminals A and B is selected, and the gate voltage 12 or 13 is selected and applied, as an optimum gate voltage, to the gate of the transistor constituting the final stage amplifier 1, whereby the final stage amplifier 1 can output transmission power while being always free from output distortion and maintaining low power consumption current characteristics.

The first embodiment exemplifies a case where gate voltage control means 17 for controlling the gate voltage applied to the gate of the final stage amplifier 1 is constituted by the comparator 11 and the switch 14.

Next, the operation of the first embodiment according to the present invention constituted as stated above will be described.

The final stage amplifier 1 into which the radio frequency signal is inputted, amplifies the radio frequency signal to specified transmission power. The amplified radio frequency signal passes through the directional coupler 3 and is then outputted as a wave from the antenna 2.

Radio frequency switches 4 and 5 selecting an ON terminal by an APC/VS detection switch signal are connected to the two terminals of the directional coupler 3, i.e., the terminal detecting the output power of the directional coupler 3 and that detecting the reflected wave, respectively.

If the output power, i.e., the transmission power outputted from the final stage amplifier 1 is detected, then the fixed terminal A sides of the switches 4 and 5 become ON terminals, the terminating resistor 7 is connected to the switch 4 and the detection diode 6 is connected to the switch 5, thereby making it possible to obtain a transmission power value converted into a DC voltage by the detection diode 6.

Further, if the reflected wave generated by the mismatching between the output impedance of the final stage amplifier 1 and the load impedance connected to the output of the final stage amplifier 1 is detected, then the fixed terminal B sides of the switches 4 and 5 become ON terminals, the detection diode 6 is connected to the switch 4 and the terminating resistor 8 is connected to the switch 5, thereby making it possible to obtain the reflected wave converted into a DC voltage by the detection diode 6.

If the transmission power value is obtained, then the fixed terminal A side of the switch 9 becomes the ON terminal, as well, the DC voltage is inputted into the APC and well-known APC control is carried out.

On the other hand, if the reflected wave is obtained, then the fixed terminal B side of the switch 9 becomes the ON terminal and the DC voltage corresponding to the reflected wave is applied to the positive terminal of the comparator 11.

The comparator 11 compares the DC voltage converted from the reflected wave applied to the positive input terminal of the comparator 11 with the threshold voltage 10 predetermined by the load impedance characteristics of the final stage amplifier 1 and the reflected wave detection characteristics of the directional coupler 3. If the DC voltage is higher than the threshold voltage 10, the comparator 11 outputs an "H" level. If the DC voltage is lower than the threshold voltage 10, the comparator 11 outputs an "L" level.

The movable terminal C of the switch 14 is switched to the fixed terminal A side or the fixed terminal B side according to the output level of the comparator 11.

If the terminal C is switched to the fixed terminal A side, the gate voltage 12 is selected and applied to the gate of the final stage amplifier 1.

If the movable terminal C of the switch 14 is switched to the fixed terminal B side, the gate voltage 13 is selected and applied to the gate of the final stage amplifier 1.

Figure 2:
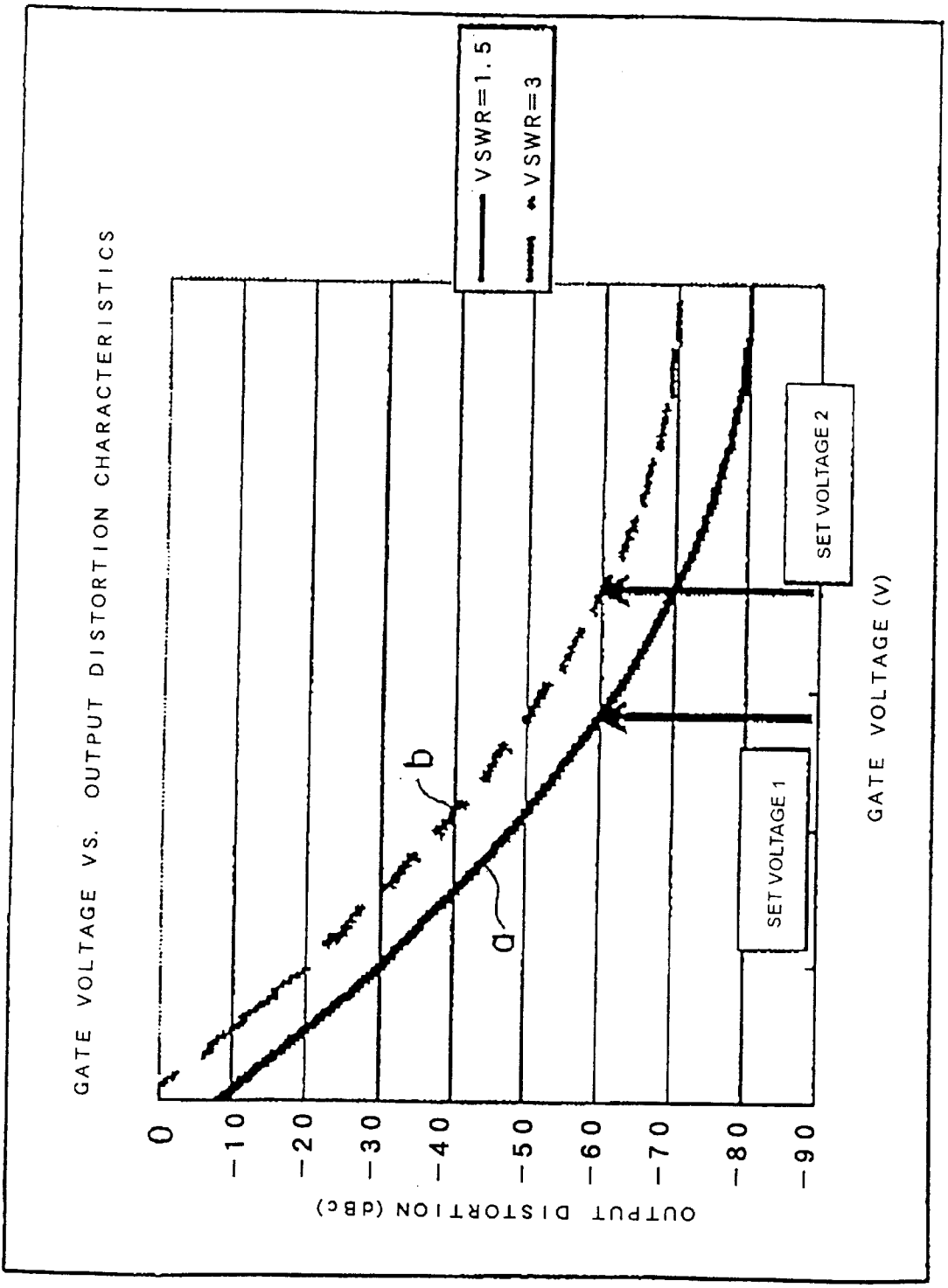
FIG. 2 is a characteristic graph showing gate voltage applied to a final stage amplifier, vs. output distortion characteristic so as to describe the operation of the transmitting circuit shown in FIG. 1.
Figure 3:
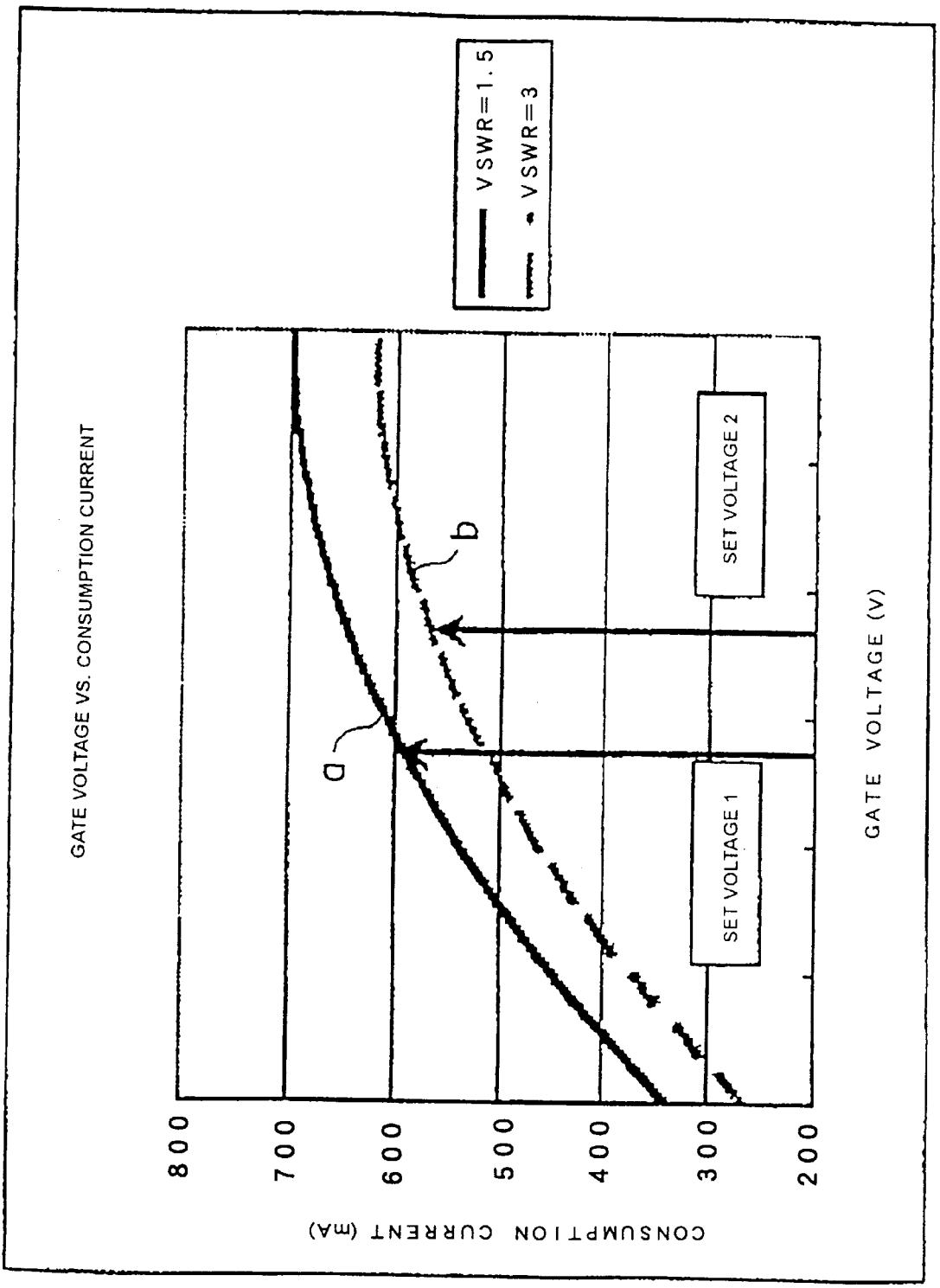
FIG. 3 is a characteristic graph of gate voltage applied to the final stage amplifier, vs. consumption power characteristics so as to describe the operation of the transmitting circuit shown in FIG. 1.

The gate voltage characteristics of the final stage amplifier 1 are shown in, for example, FIGS. 2 and 3. FIG. 2 shows the gate voltage vs. output distortion characteristics, while the horizontal axis denotes gate voltage (V) and the vertical axis denotes output distortion (dBc).

A set voltage 1 (e.g., the above-stated gate voltage 12) indicated by the characteristic a of a solid line is VSWR (voltage to standing wave ratio)=1.5, and a set voltage 2 (e.g., the above-stated gate voltage 13) indicated by the characteristic b of a broken line is VSWR=3.

Further, FIG. 3 shows gate voltage vs. consumption current characteristics, while the horizontal axis denotes gate voltage (V) and the vertical axis denotes consumption current (mA).

In FIG. 3 as in the case of FIG. 2, a set voltage 1 (e.g., the above-stated gate voltage 12) indicated by the characteristic a of a solid line is VSWR (voltage to standing wave ratio)=1.5, and a set voltage 2 (e.g., the above-stated gate voltage 13) indicated by the characteristic b of a broken line is VSWR=3.

The gate voltage 12 or gate voltage 13 predetermined by such gate voltage characteristics is selected by switching the movable terminal C of the switch 14 in accordance with the output of the comparator 11, and applied to the gate of the final stage amplifier 1, whereby the terminating amplifier 1 applied with the optimum gate voltage can output transmission power without always being free from output distortion and maintaining low consumption power characteristics.

By regularly switching the respective movable terminals C of the switches 4, 5 and 9 to the fixed terminal A or the fixed terminal B by the APC/JVS detection signal, the switches 4, 5 and 9 appropriately repeat transmission power detection and reflected wave detection in a time division manner and secure constantly stable transmission power and an optimum gate voltage applied to the final stage amplifier 1.

As can be seen from the above description, in the first embodiment, the reflected wave generated by the mismatching between the output impedance of the final stage amplifier 1 and the load impedance connected to the output side of the final stage amplifier 1 can be detected, and the gate voltage suited for the load impedance can be set by the comparator 11 and the switch 14 which serve as the gate voltage control means 17. Thus, it is possible to dispense with an isolator which is a large-sized component conventionally necessary and to thereby miniaturize the mobile communication equipment.

Moreover, if the isolator can be dispensed with, specified transmission power may be outputted from the final stage amplifier 1. It is, therefore, possible to reduce the consumption power of the final stage amplifier 1.

Figure 4:
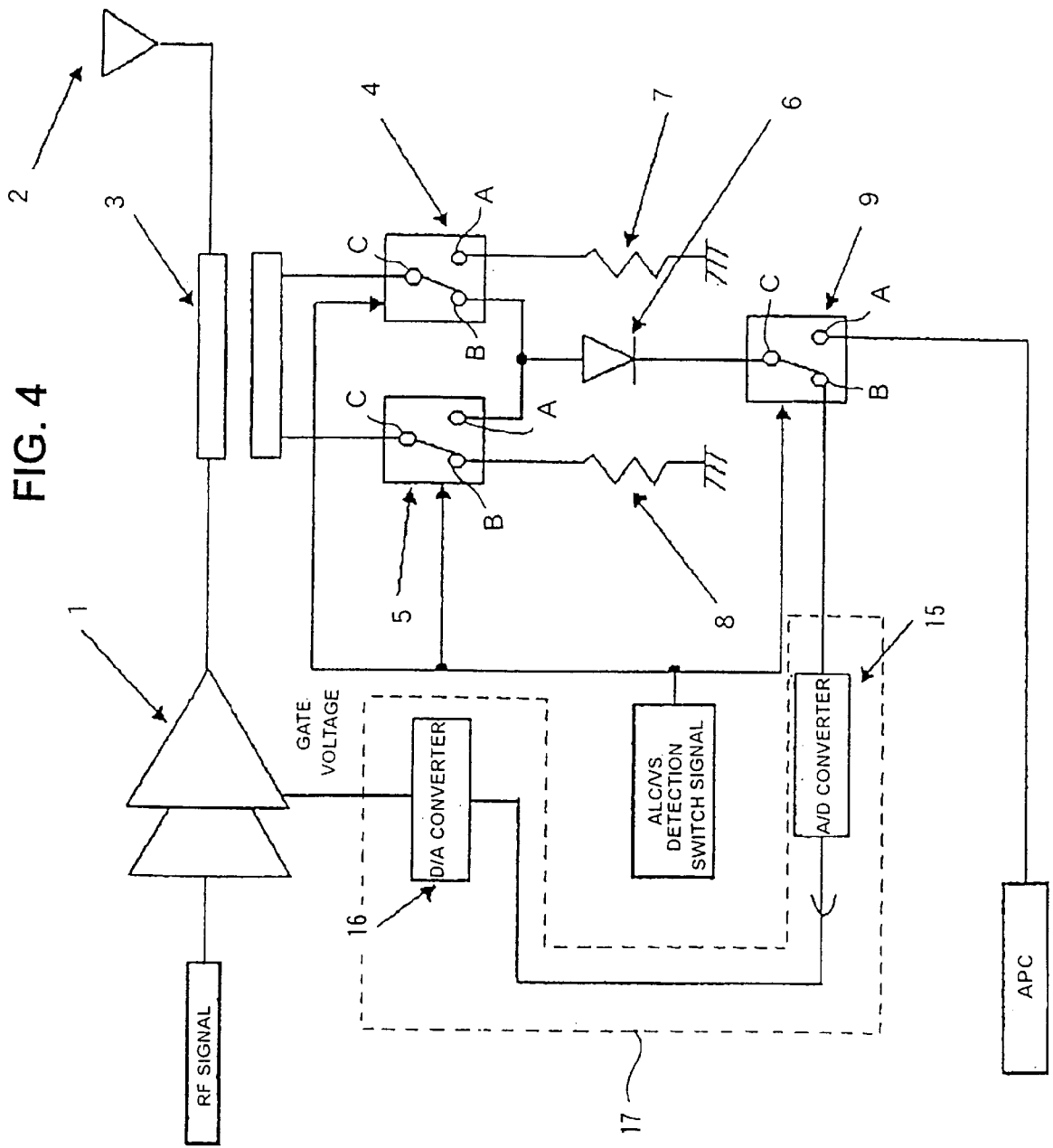
FIG. 4 is a block diagram showing the constitution of a second embodiment of a transmitting circuit according to the present invention.
Figure 5:
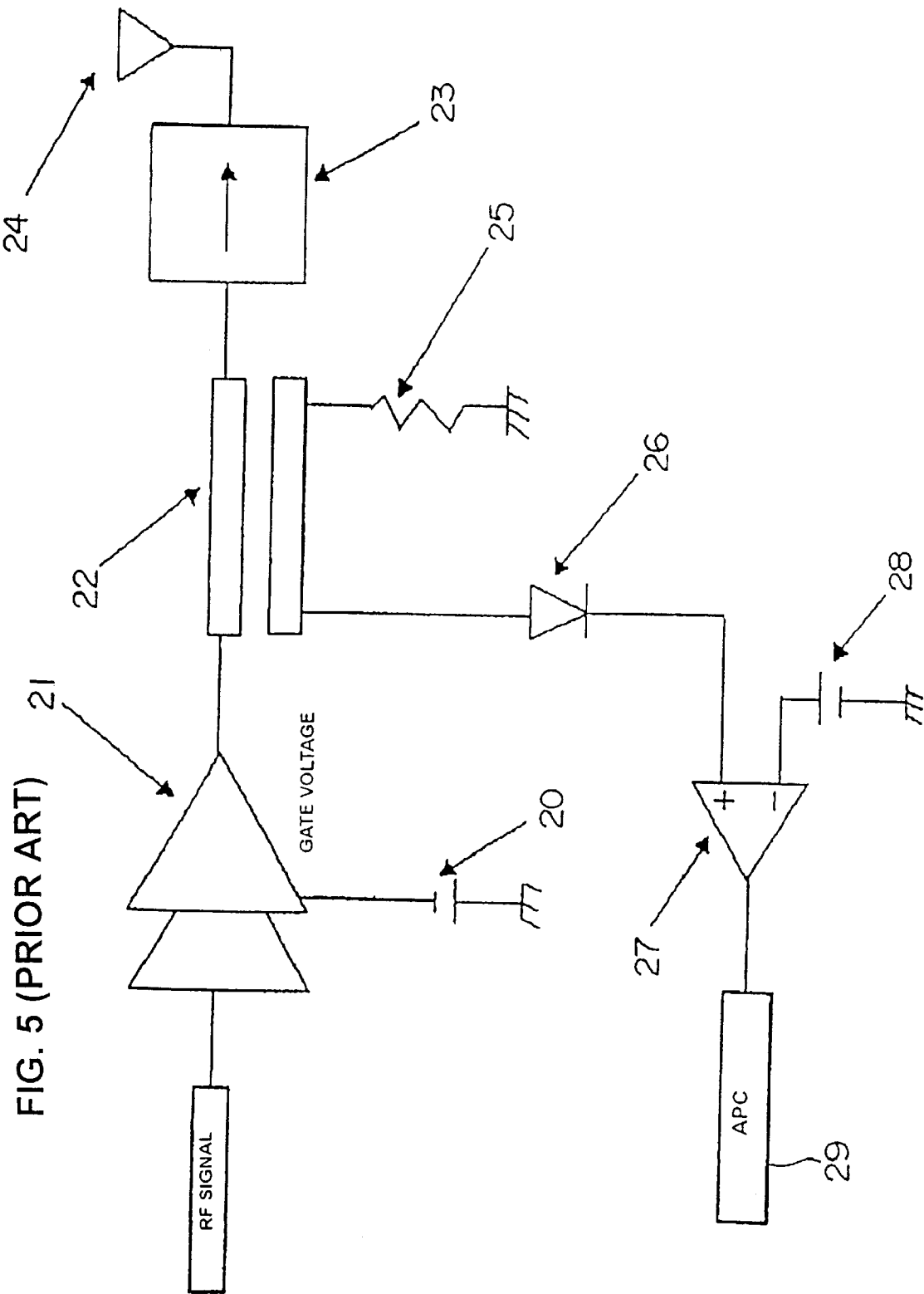
FIG. 5 is a block diagram showing the constitution of a conventional transmitting circuit.

Next, a second embodiment according to this invention will be described. FIG. 4 is a block diagram showing the constitution of the second embodiment.

In the description of the constitution with reference to FIG. 4, the same parts as those in FIG. 1 are denoted by the same reference symbols, repetitive description will not be given and only the different parts from FIG. 1 will be described hereinafter.

In the second embodiment shown in FIG. 4, the constitution of gate voltage control means 17 differs from that in the first embodiment.

In FIG. 4, the gate voltage control means 17 is constituted by an A/D converter 15 and a D/A converter 16 instead of the comparator 11 and the switch 14 stated above.

That is to say, the fixed terminal of the switch 9 is connected to the input terminal of the A/D converter 15. The output terminal of this A/D converter 15 is connected to the input terminal of the D/A converter 16 and a gate voltage is applied from the output terminal of the D/A converter 16 to the gate of the final stage amplifier 1. The remaining constitution is the same as that shown in FIG. 1.

By constituting the gate voltage control means 17 as stated above, a DC voltage corresponding to the reflected wave converted into the DC voltage is outputted from the fixed terminal B of the switch 9 if the directional coupler 3 detects the reflected wave as already described above.

The DC voltage outputted from the fixed terminal B of the switch 9 is inputted into the A/D converter 15 and converted into digital data (e.g., 8-bit data).

The converted data is inputted into the D/A converter 16 preset so that an optimum gate voltage can be applied to the final stage amplifier 1 according to the magnitude of the reflected wave (=data), through a data bus.

The D/A converter 16 applies the gate voltage which is an analog voltage to the final stage amplifier 1.

In this way, if not two types but the necessary number of gate voltages preset and applied to the gate of the final stage amplifier 1 from the D/A converter 16 are prepared, it is possible to derive the more suitable electrical characteristics of the final stage amplifier 1.

What is claimed is:

1. A transmitting circuit which comprises:
   a final stage amplifier amplifying an inputted radio frequency (RF) signal up to a specified transmission output, and capable of controlling consumption power and output distortion by a direct current (DC) voltage applied to a gate;
   a directional coupler having both a terminal capable of detecting output power outputted from said final stage amplifier and another terminal capable of detecting a reflected wave generated by mismatching between an output impedance of said final stage amplifier and a load impedance connected to an output side of said final stage amplifier;
   two first switches selecting said terminals of said directional coupler in a time division manner;
   a terminating resistor provided to correspond to each of said first switches, and terminating the terminal of said directional coupler unselected by said first switches;
   a detection diode converting each of the output power and the reflected wave obtained by said directional coupler into a DC voltage;
   a second switch selecting, switching and outputting one of the DC voltage with respect to said output power and the DC voltage with respect to said reflected wave obtained by said detection diode; and
   gate voltage control means for applying a gate voltage suited for said load impedance to said final stage amplifier in accordance with the DC voltage with respect to said reflected wave selected by said second switch.

2. The transmitting circuit according to claim 1, wherein said gate voltage control means comprises:
   a comparator for comparing a threshold voltage predetermined by characteristics of the load impedance connected to the output side of said final stage amplifier with the DC voltage obtained by detecting said reflected wave outputted from said second switch by said detection diode, and for outputting an output of which level changes according to whether said DC voltage is higher or lower than said threshold voltage; and
   a third switch selectively switching said plurality of gate voltages depending on an output of said comparator, and applying the switched gate voltage to said final stage amplifier.

3. The transmitting circuit according to claim 1, wherein said comparator outputs an "H" level or an "L" level depending on whether said direct current voltage is higher or lower than said threshold voltage.

4. The transmitting circuit according to claim 2, wherein two types of gate voltages having different voltage levels are provided as said gate voltages.

5. The transmitting circuit according to claim 1, wherein said gate voltage control means comprises:
   an A/D converter for inputting the DC voltage obtained by detecting said reflected wave outputted from said second switch by said detection diode, and for converting the inputted DC voltage into digital data; and
   a D/A converter for inputting said data converted by said A/D converter and for applying an optimum analog gate voltage to said final stage amplifier in accordance with a magnitude of said reflected wave in advance.

6. The transmitting circuit according to claim 4, wherein not less than two types of said gate voltages are selectively applied from said D/A converter to said final stage amplifier.

7. The transmitting circuit according to claim 1, wherein said two first switches are terminated by the terminating resistor when said directional coupler detects a transmission power value outputted from said final stage amplifier.

8. The transmitting circuit according to claim 1, wherein said second switch supplies a DC voltage of a transmission power value obtained by said detection diode to an automatic output power control circuit to allow the automatic output control circuit to conduct automatic output control over said final stage amplifier when said directional coupler detects the transmission power value outputted from said final amplifier.

* * * * *